United States Patent
Mayes (10) Patent No.: US 7,527,101 B2
(45) Date of Patent: May 5, 2009

(54) COOLING APPARATUS AND METHOD (75) Inventor: James C. Mayes, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 288 days.

(21) Appl. No.: 10/905,954

(22) Filed: Jan. 27, 2005

(65) Prior Publication Data

US 2006/0162931 A1 Jul. 27, 2006

(51) Int. Cl.
*E21B 36/00* (2006.01)
(52) U.S. Cl. ...................... 166/302; 166/65.1
(58) Field of Classification Search ............... 166/302, 166/65.1; 62/260
See application file for complete search history.

(56) References Cited

U.S. PATENT DOCUMENTS

| 5,517,464 A | 5/1996 | Lerner et al. |
| 5,730,217 A * | 3/1998 | Owens et al. ............... 166/57 |
| 5,793,625 A | 8/1998 | Balogh |
| 5,817,188 A | 10/1998 | Yahatz et al. |
| 5,931,000 A | 8/1999 | Turner et al. |
| 6,084,403 A * | 7/2000 | Sinclair et al. ............ 324/221 |
| 6,134,892 A * | 10/2000 | Turner et al. ................ 62/3.2 |
| 6,150,601 A | 11/2000 | Schnatzmeyer et al. |

OTHER PUBLICATIONS

"Melcor Thermal Solutions" Advertising brochure, *A Fedders Engineered Products Company*, Trenton, NJ.

* cited by examiner

*Primary Examiner*—Hoang Dang
(74) *Attorney, Agent, or Firm*—James L. Kurka; Jonna T. Flores; Darla P. Fonseca (57) ABSTRACT

A device and method provide for cooling of a system having an energy source, one or more devices that actively consume energy, and one or more devices that generate heat. The device may include one or more thermoelectric coolers ("TECs") in conductive engagement with at least one of the heat-generating devices, and an energy diverter for diverting at least a portion of the energy from the energy source that is not consumed by the active energy-consuming devices to the TECs.

18 Claims, 5 Drawing Sheets

COOLING APPARATUS AND METHOD

STATEMENT REGARDING FEDERALLY SPONSORED RESEARCH OR DEVELOPMENT

This invention was made with Government support under Cooperative Agreement No. DE-FC26-03NT41835 awarded by the Department of Energy (DOE). The Government has certain rights in this invention.

BACKGROUND OF THE INVENTION

1. Field of the Invention

The present invention relates to thermal control of heat-generating devices within a system, and more particularly to powering the means used to cool heat-generating devices within a downhole tool string.

2. Background of the Related Art

The drilling of oil and gas wells (also known as wellbores or boreholes) typically involves the use of several different measurement and telemetry systems to acquire data representing certain parameters of a subsurface formation (also known as a downhole reservoir) via a borehole penetrating the formation, and data representing the state of various drilling and/or borehole survey parameters. In measurement-while-drilling (MWD) and logging-while-drilling (LWD) tools, data is typically acquired by sensors located in the drill string near the drill bit. This data is either stored in downhole memory or transmitted to the surface using a telemetry means, such as mud flow telemetry devices.

Both the downhole sensors and the telemetry means of the MWD/LWD tools require electrical power. Since it is not feasible to run a power supply cable from the surface through the drill string to the sensors or the telemetry means, electrical power must be obtained downhole. The state of the art MWD and LWD devices obtain electrical power downhole from energy sources such as a turbine-based alternator, a battery pack, or combinations thereof. Examples of alternators used in downhole tools are shown in U.S. Pat. No. 5,517,464, assigned to the assignee of the present invention, and U.S. Pat. No. 5,793,625 assigned to Baker Hughes. Because of the physics involved, as well as practical design limitations, these types of energy sources (as well as others) often generate excess quantities of energy that the downhole tools cannot actively consume. Such excess energy must therefore be dissipated as waste energy through an energy sink, such as by transferring heat through the wall of a drill collar to the drilling fluid (also known as mud) being circulated through the borehole annulus.

It will be appreciated by those having ordinary skill in the art that virtually all downhole tools generate appreciable quantities of heat. Thus, e.g., operating LWD tools may typically generate heat on the order of 10 W or more; operating MWD tools may typically generate heat on the order of 100 W or more; and mechanical tools such as direction drilling tools may generate heat on the order of 1 KW or more when actuated. Sustained heat exposure can detrimentally affect the performance of these tools. Moreover, these tools often include electronic components such as controllers, amplifiers, oscillators, filters, switches, clocks, etc., that are very sensitive to temperatures above their rated or specified levels, or to sustained exposure at high temperature, particularly when exposed to temperatures above their maximum rating or specifications. Overheating of electronic components can result in improper operation, reduced accuracy, immediate failure, or a significant reduction in life. However, the ambient temperature of the borehole environment at depth is often elevated to the point that the mud circulating therethrough may not provide adequate cooling for the downhole tools and their respective components. A need therefore exists for providing supplemental cooling in downhole tool strings.

At least one known publication, U.S. Pat. No. 5,931,000 issued to Turner et al, describes the use of thermoelectric coolers ("TECs") for providing supplemental cooling of electronic components within downhole tools. However, the current required to effectively operate one or more TECs is very high, on the order of several Amps—amounts that are not always readily available or efficiently generated by a downhole tool string. One aspect of the present invention recognizes that available waste energy, particularly in significant amounts, can be used to advantage with TECs. The Turner patent fails to disclose that excess energy may be diverted (i.e., recycled) to energize the TECs. Accordingly, a need exists for applying the excess energy that would otherwise be dissipated to downhole tool strings in such a manner that the requisite supplemental cooling is achieved.

DEFINITIONS

Certain terms are defined throughout this description as they are first used, while certain other terms used in this description are defined below:

"Actively consume energy" means consuming energy for a purpose other than cooling.

"Downhole tool" means a tool deployed into the wellbore by means such as a drill string, wireline, or coiled tubing for performing downhole operations related to the evaluation, production, and/or management of one or more subsurface formations of interest.

"Tool string" means an assembly of downhole tools, typically (but not necessarily) including more than one downhole tool.

"Turbine generator" means an electromechanical device such as a generator or alternator used to generate electrical power from the flow of fluids such as drilling mud through or past the device.

SUMMARY OF THE INVENTION

The needs identified herein, as well as other needs, objects, and advantages are addressed by the present invention. In one aspect, the invention provides an apparatus for cooling a system having an energy source, one or more devices that actively consume energy, and one or more devices that generate heat. The inventive apparatus comprises one or more thermoelectric coolers ("TECs") disposed in conductive engagement with at least one of the heat-generating devices, and an energy diverter disposed for diverting at least a portion of the energy from the energy source that is not consumed by the active energy-consuming devices to the TECs. In this manner, cooling is provided for the cooler-engaged heat-generating devices.

In particular embodiments of the inventive apparatus, the system comprises a tool string conveyed within a borehole. In such embodiments, the one or more TECs are carried by the tool string in conductive engagement with at least one of the heat-generating devices. The tool string may, e.g., be part of a drill string conveyed within the borehole, or the tool string may be conveyed within the borehole on a wireline.

The tool string may be equipped in various ways. Thus, e.g., the tool string may comprise: one or more tools for sensing one or more survey parameters such as direction, inclination, and toolface; and/or one or more tools for sensing one or more parameters of a formation penetrated by the borehole, such as formation resistivity, natural radiation, density (gamma ray or neutron), and pore pressure; and/or one or more tools for enabling and controlling the penetration of the drill string into the formation during conventional or directional drilling operations, such as a drilling motor or a steerable drilling motor.

In particular embodiments of the inventive apparatus, such as drill string embodiments, the energy source may comprise: a turbine generator for converting the hydraulic energy of drilling fluid pumped through the drill string into electrical energy; and/or one or more batteries conveyed with the tool string.

In other embodiments of the inventive apparatus, such as wireline applications, the energy source may comprise a power supply disposed at the surface and one or more electrical conductors running through the wireline for conducting electricity between the power supply and the tool string.

The active energy-consuming devices may comprise virtually any down hole tool, such as, e.g.: one or more tools for sensing one or more survey parameters such as direction, inclination, and toolface; and/or one or more tools for sensing one or more parameters of a formation penetrated by the borehole, such as formation resistivity, natural radiation, density (gamma ray or neutron), and pore pressure; and/or one or more tools for enabling and controlling the penetration of the drill string into the formation during conventional or directional drilling operations, such as a drilling motor or a steerable drilling motor.

The heat-generating devices may similarly comprise virtually any downhole tool, such as, e.g.: one or more tools for sensing one or more survey parameters such as direction, inclination, and toolface; and/or one or more tools for sensing one or more parameters of a formation penetrated by the borehole, such as formation resistivity, natural radiation, density (gamma ray or neutron), and pore pressure; and/or one or more tools for enabling and controlling the penetration of the drill string into the formation during conventional or directional drilling operations, such as a drilling motor or a steerable drilling motor.

In particular embodiments of the inventive apparatus, the energy diverter comprises a voltage comparator.

In another aspect, the present invention provides a method for cooling a system having an energy source, one or more devices that actively consume energy, and one or more devices that generate heat. The method comprising the steps of equipping at least one of the heat-generating devices with one or more thermoelectric coolers disposed in conductive engagement therewith, and diverting at least a portion of the energy from the energy source that is not consumed by the active energy-consuming devices to the thermoelectric coolers so as to provide cooling for the cooler-engaged heat-generating devices.

In particular embodiments of the inventive method, the system comprises a tool string conveyed within a borehole. The tool string may, e.g., be part of a drill string conveyed within the borehole, or the tool string may be conveyed within the borehole on a wireline.

BRIEF DESCRIPTION OF THE DRAWINGS

So that the above recited features and advantages of the present invention can be understood in detail, a more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1A:
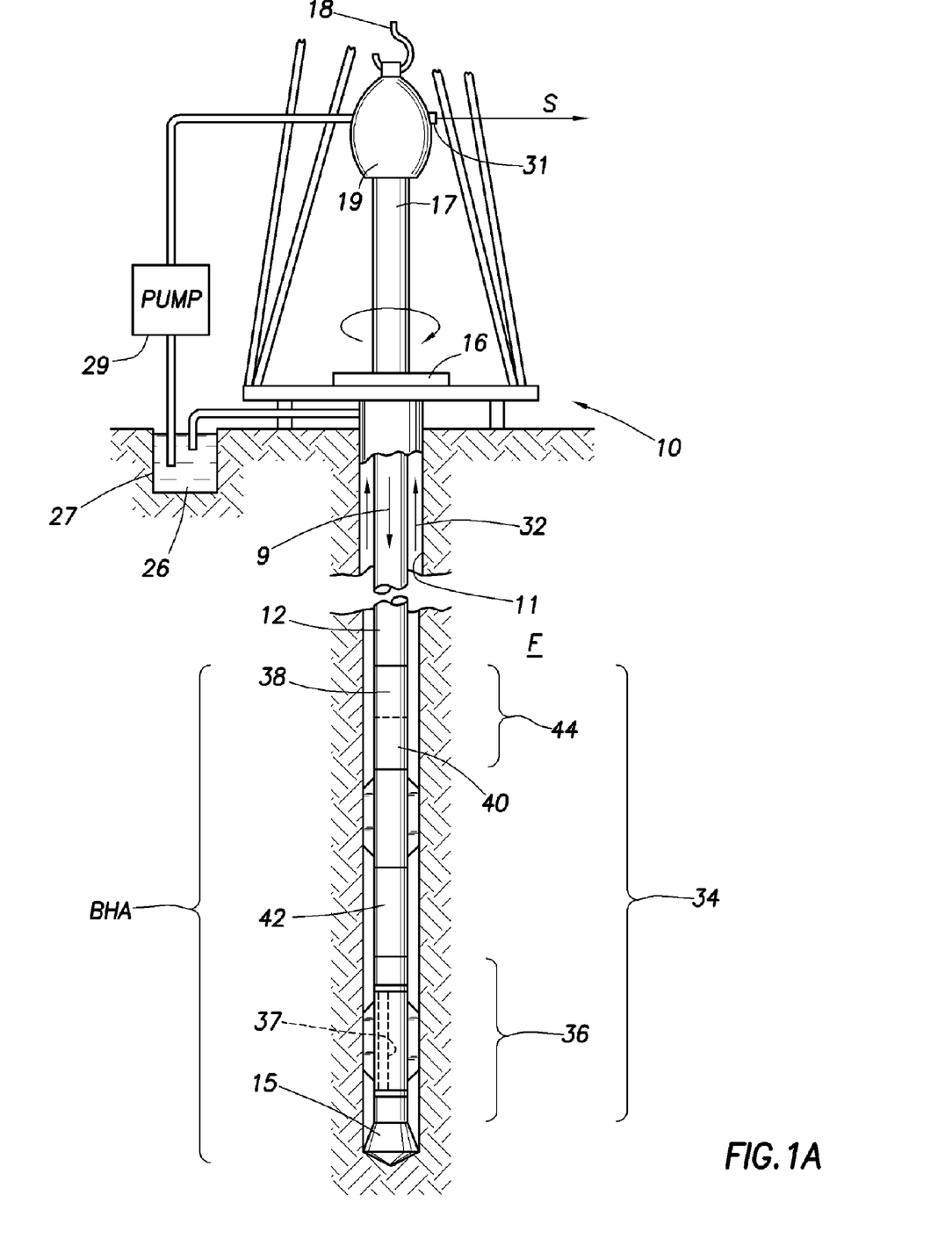
FIG. 1A is an elevational representation of a conventional rotary drilling string in which the present invention may be employed to advantage.

FIG. 1A illustrates a convention drilling rig and drill string in which the present invention can be utilized to advantage. A land-based platform and derrick assembly 10 are positioned over a borehole 11 penetrating a subsurface formation F. In the illustrated embodiment, the borehole 11 is formed by rotary drilling in a manner that is well known. Those of ordinary skill in the art given the benefit of this disclosure will appreciate, however, that the present invention also finds application in drilling applications other than conventional rotary drilling (e.g., mud-motor based drilling systems, as described below), and is not limited to land-based rigs.

Figures 1B, 2:
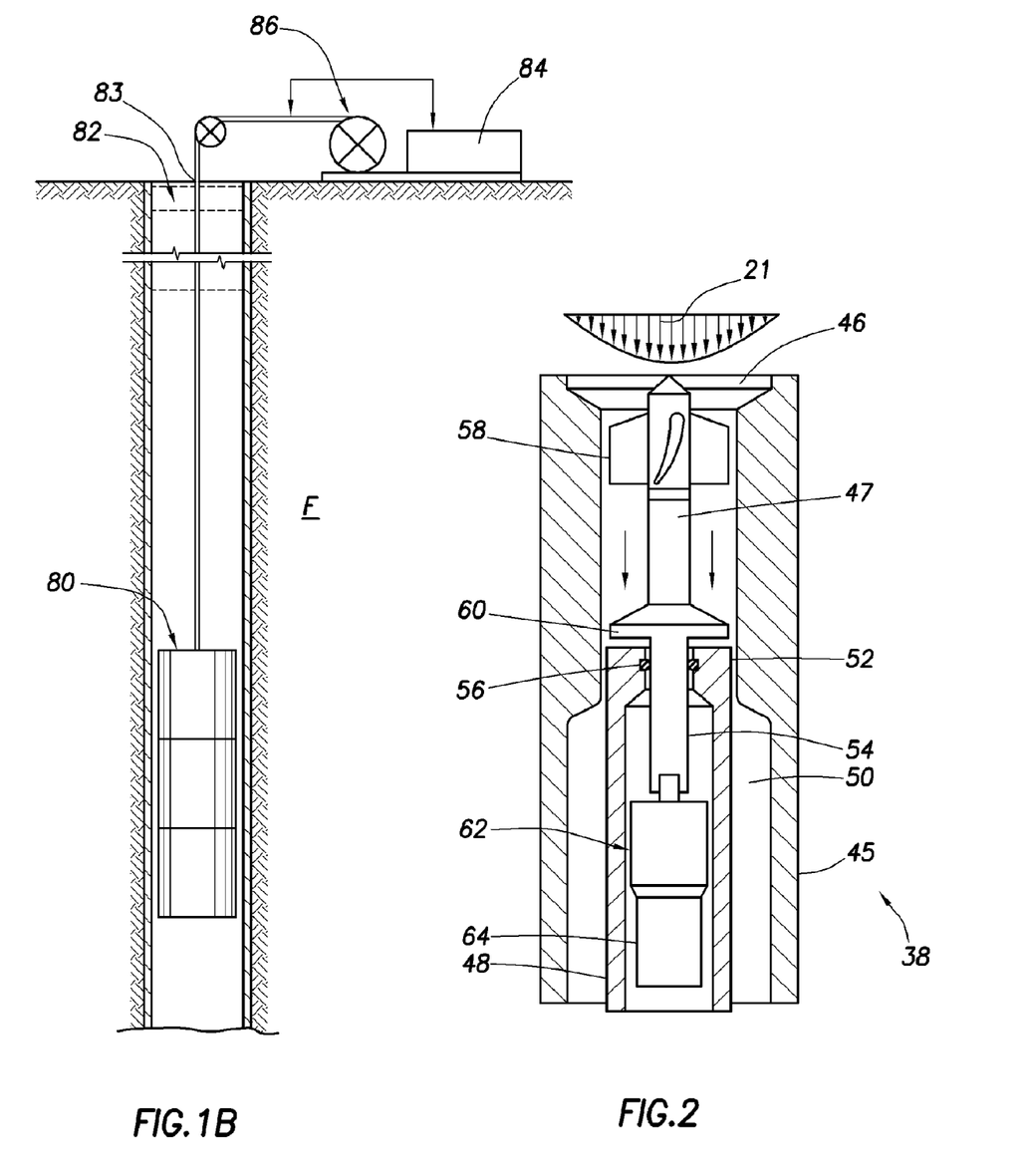
FIG. 1B is an elevational representation of a conventional wireline-conveyed tool string in which the present invention may be employed to advantage.
FIG. 2 is simplified schematic of a telemetry and power subsystem of a conventional MWD tool with which the present invention may be employed to advantage.

Nor is the present invention limited to drilling applications; it may be applied to advantage in other downhole tool string applications such as wireline logging, as shown in FIG. 1B. Wireline logging employs a downhole tool string 80 conveyed into a borehole 82 by means of an armored steel cable 83, known as a wireline cable or simply a wireline. The logging measurements are made by the tool string 80 (i.e., downhole instruments) and are transmitted back to the surface through electrical conductors in the wireline cable 83. The cable length, which substantially determines the relative depth of the tool string 80, is controlled by suitable means at the surface such as a drum and winch mechanism, referenced generally as 86. Surface equipment 84 includes a data processor subsystem and conventional means for powering and communicating with the tool string 80 via the wireline 83. For purposes of clarity, the present invention will be described hereafter in association with drill strings.

Returning to FIG. 1A, a drill string 12 is suspended within the borehole 11 and includes a drill bit 15 at its lower end. The drill string 12 may be rotated by a rotary table 16, energized by means not shown, which engages a kelly 17 at the upper end of the drill string. The drill string 12 is suspended from a hook 18, attached to a traveling block (also not shown), through the kelly 17 and a rotary swivel 19 which permits rotation of the drill string relative to the hook.

Drilling fluid, or mud, 26 is stored in a pit 27 formed at the well site. A pump 29 delivers the drilling fluid 26 to the interior of the drill string 12 via a port in the swivel 19, inducing the drilling fluid to flow downwardly through the drill string 12 as indicated by the directional arrow 9. The drilling fluid exits the drill string 12 via ports in the drill bit 15, and then circulates upwardly through the region between the outside of the drill string and the wall of the borehole, called the annulus, as indicated by the directional arrows 32. In this manner, the drilling fluid lubricates the drill bit 15, provides a means for generating power, provides a means for communicating both uphole and downhole, and carries formation cuttings up to the surface as it is returned to the pit 27 for recirculation.

The drill string 12 further includes a bottom hole assembly BHA near the drill bit 15 (in other words, within several drill collar lengths from the drill bit). The BHA includes a tool string 34 for measuring, processing, and storing information, as well as communicating with the surface. The tool string 34 thus includes, among other things, an apparatus (or string of apparatuses) 36 for determining and communicating one or more properties of the formation F surrounding borehole 11, such as formation resistivity (or conductivity), natural radiation, density (gamma ray or neutron), and pore pressure. Such apparatuses may be primarily powered by battery banks 37, and may include, e.g., one or more formation evaluation and/or imaging tools.

The tool string 34 further includes drill collars 42, 44 for performing various other measurement functions. Drill collar 44, in particular, houses a measurement-while-drilling (MWD) tool, such as a telemetry and/or surveying tool. The MWD tool includes a telemetry and power subassembly 38 that communicates with a complementing system (not shown) at the earth's surface. In addition to providing power for telemetry means (described further below), the subassembly 38 communicates data/commands with, and provides power for, a control/sensor package 40 within the MWD tool. The control/sensor package 40 includes appropriate instrumentation for acquiring real-time survey parameters such as direction, inclination, and toolface, among other things. The telemetry and power subassembly 38, also generally known as a modulator and turbine generator, is illustrated schematically in FIG. 2. The subassembly 38 includes a sleeve 45 secured within the drill collar 44 (not shown in FIG. 2). The sleeve 45 has an upper open end 46 into which the drilling fluid, or mud, flows in a downward direction as indicated by the downward arrow velocity profile 21. A stator 48, which also generally serves as a tool housing, is secured against rotation relative to the drill collar 44 by being mounted within the flow sleeve 45, thereby creating an annular passage 50. The upper end of the stator 48 carries modulator stator blades 52.

A rotor 47 and drive shaft 54, which are secured concentrically for common rotation, are centrally mounted in the upstream end of the stator 48 by a rotary sealing/bearing assembly 56. The rotor 47 is disposed upstream of the stator 48, while the drive shaft 54 extends both upwardly out of the stator 48 and downwardly into the stator 48. A turbine impeller 58 is mounted at the upper end of the rotor 47 just downstream from the upper open end 46 of the sleeve 45. A modulator rotor 60 is mounted on the rotor 47 downstream of the turbine impeller 58 and immediately upstream of the modulator stator blades 52. The modulator rotor 60 and the stator 48 cooperate to generate a pressure pulse-signal which is representative of the measured drilling parameters. The generated signal is conveyed upwardly through the drill string 12 via "pulses" in the drilling fluid and is received at the surface by transducers, represented by reference numeral 31 (see FIG. 1), that convert the received acoustical signals to electronic signals S for further processing, storage, and use according to conventional methods and systems. The lower end of the drive shaft 54 is coupled to a gear train/control module 62 which is mounted within the stator 48 and which, in turn, is coupled to an alternator 64. The alternator 64 is mounted in the stator 48 downstream of the gear train/control module 62.

Figure 3:
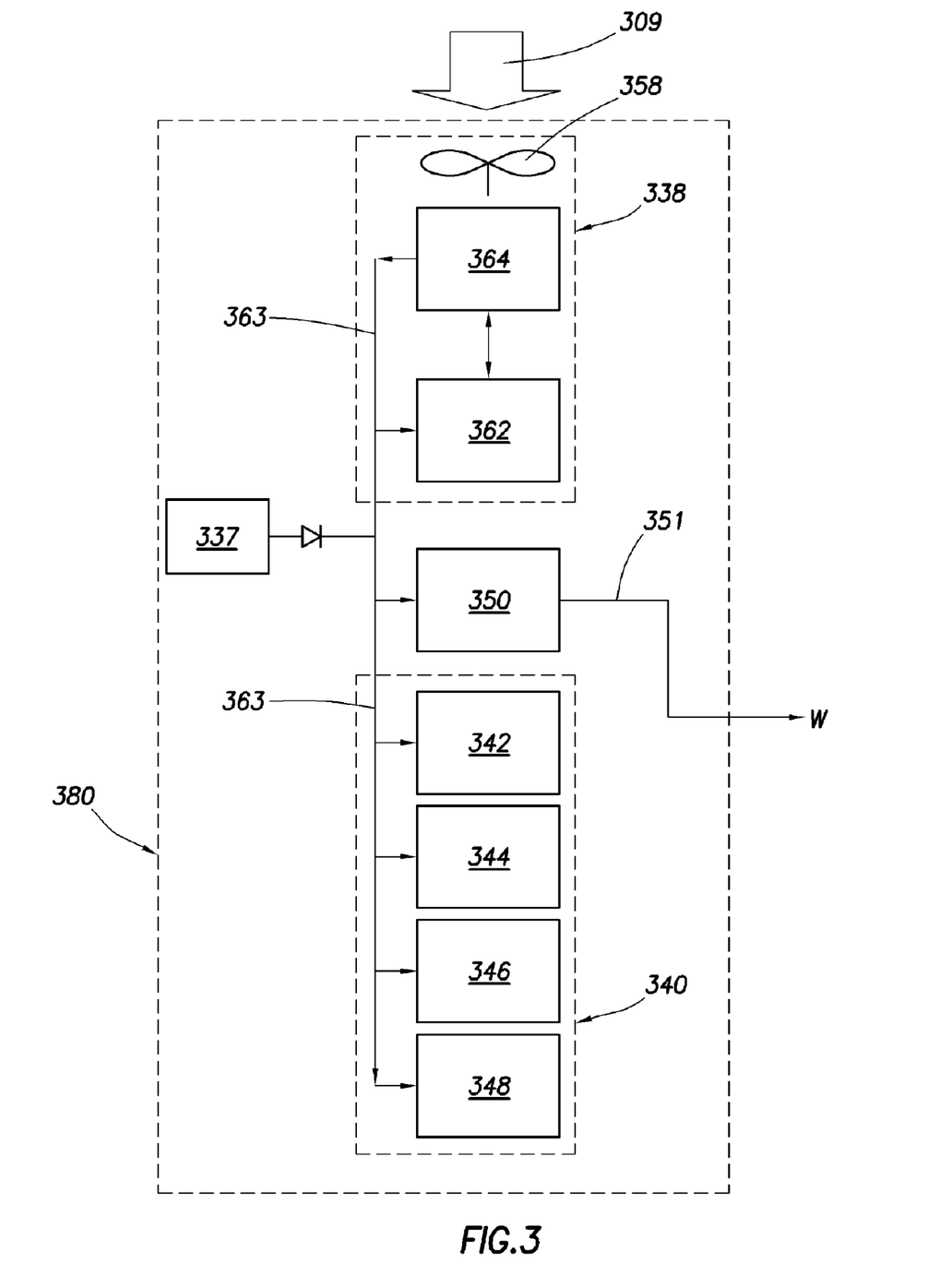
FIG. 3 is a block diagram representation of a conventional MWD tool string showing waste energy being dissipated as heat.

FIG. 3 shows a block diagram representation of a similar MWD tool string 380 positioned in a borehole (not shown) having fluid or mud 309 pumped downwardly therethrough. The force of the mud 309 bears upon an impeller 358 which converts the hydraulic energy of the mud 309 into rotational energy applied to a progressive cavity motor/alternator assembly 364 controlled by a controller 362, all within the power section 338 of an MWD tool. It will be appreciated by those skilled in the art that the progressive cavity motor of motor/alternator assembly 364 may alternatively be operated as a progressive cavity pump by direct (as opposed to reverse) application of the Moineau pump principle. This may be achieved by an input of rotational energy from a power supply 337 to the progressive cavity pump, which would convert rotational energy into hydraulic energy, e.g., to modulate the impeller 358 so as to transmit one or more data signals uphole.

Reverse application of the Moineau pump principle in the progressive cavity motor of motor/alternator assembly 364 produces electrical energy delivered to bus 363 for energizing the controller 362 and the components of the MWD control/sensor package 340. These energized components include controller 342, acquisition electronics 344, and sensors 346, 348 (e.g., survey sensors for determining parameters such as direction, inclination, and/or toolface). An energy diverter 350, which may include a voltage comparator, is disposed in the MWD tool string 380 for diverting waste electrical energy (i.e., excess energy) from the bus 363 through a pathway 351 to the wall W of a drill collar housing the MWD tool, where the waste energy is dissipated as heat.

Figure 4:
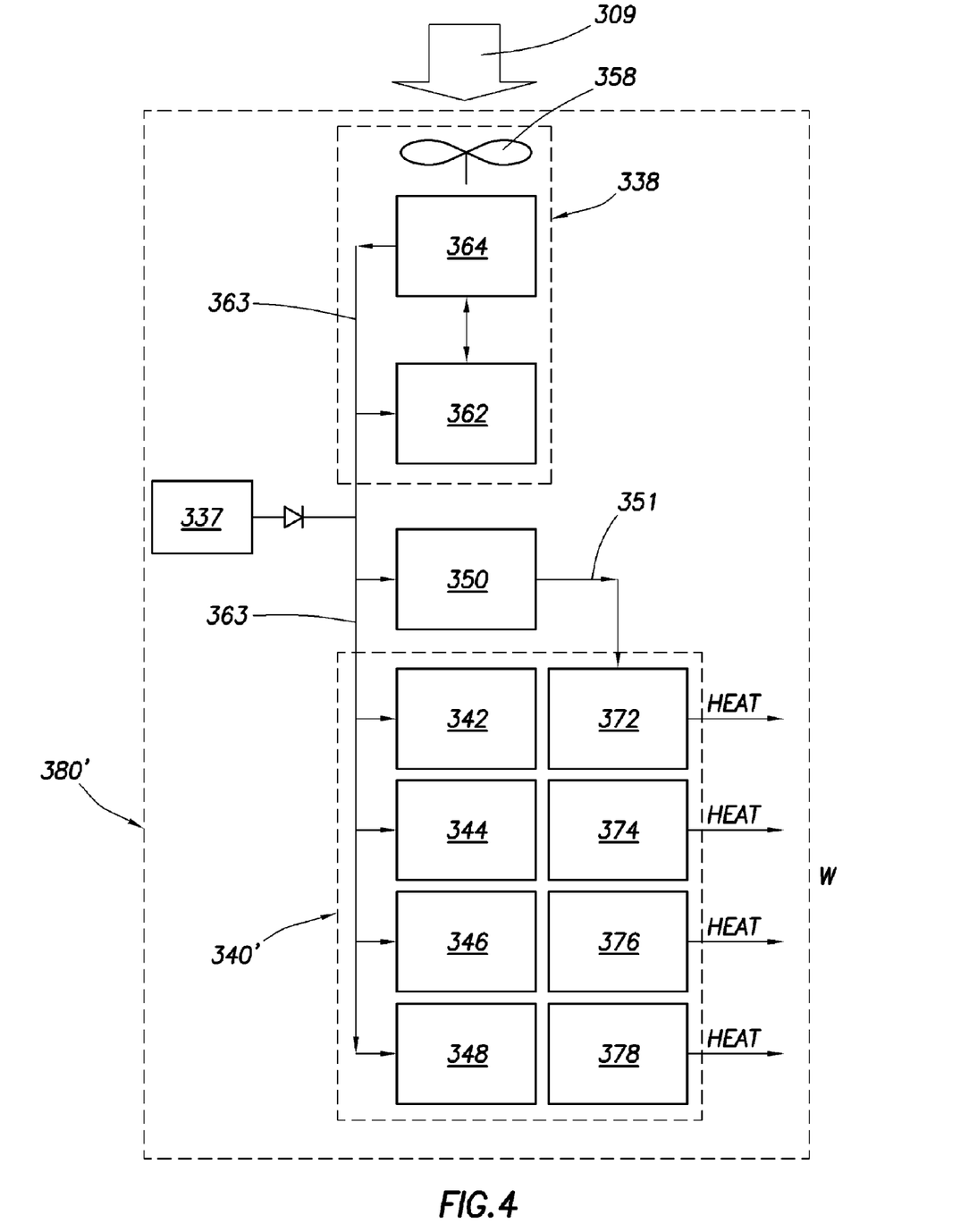
FIG. 4 is a block diagram representation of a MWD tool string incorporating TECs that utilize waste energy for cooling in accordance with the present invention.

FIG. 4 is similar block diagram to that of FIG. 3, but illustrates a bank of thermoelectric coolers 372, 374, 376, 378 carried by a MWD tool string 380' in conductive engagement with the respective components of a MWD control/sensor package 340'. A typical high-temperature thermoelectric cooler ("TEC") manufactured by Melcor and suitable for use in the present invention is shown schematically in FIG. 5 (and referenced as 570). TEC assemblies are solid state heat pumps that extract or add heat to an object or region, and so can be used for cooling or heating, depending on the specific application. They can also be used to generate electrical current. Such assemblies are currently used in a wide variety of applications in order to affect the thermal environment of a particular object or region.

Figure 5:
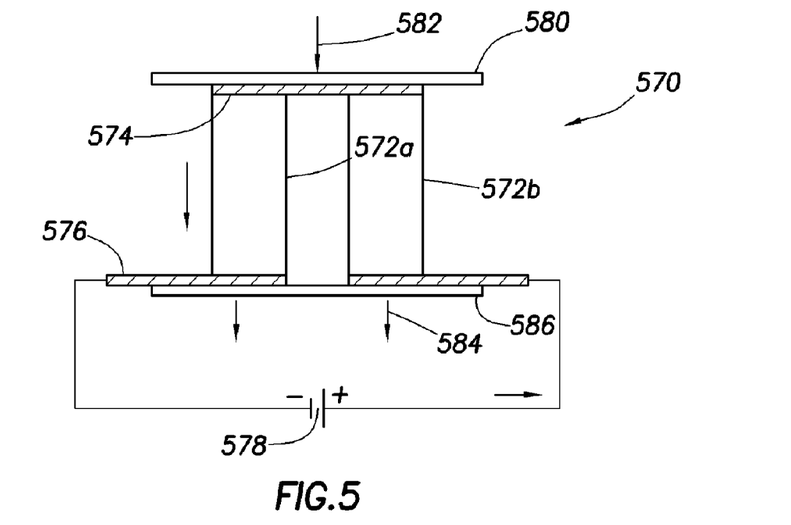
FIG. 5 is a schematic representation of a TEC having application to the present invention.

TEC 570 essentially consists of two different types of high performance crystalline semiconductors 572a and 572b, which are typically p-type and n-type semiconductors, respectively, that are arranged between plates 574 and 576, the latter being typically made from a ceramic material. The semiconductors 572a, 572b are electrically-connected in series and thermally-connected in parallel. A DC power source 578 (e.g., a turbine alternator and/or battery bank) provides energy to move electrons through the TEC. When a positive DC voltage from the power source 578 is applied to the n-type semiconductor 572b, electrons pass from the low-energy p-type semiconductor 572a to the high-energy n-type semiconductor 572b. In so doing, the electrons absorb energy (i.e., heat) through a process known as the Peltier Effect. As the electrons pass from the high-energy n-type semiconductor 572b to the low energy p-type semiconductor 572a, heat is expelled. Thus, heat energy 582 is initially transferred from a heat source 580 (such as a component within a tool string) to a cold junction, or cold plate, 574. This heat 582 is then transferred by the semiconductors to a hot junction, or hot plate, 576. The heat transferred is proportional to the current passing through the semiconductors and the number of TEC units. From the hot plate 576, the heat 584 is transferred to a heat sink 586 (such as the wall of a drill collar). Thus, TECs essentially cause heat to flow from a lower temperature to a higher temperature, analogous to pumping a fluid from a lower elevation to a higher elevation.

TEC assemblies (also known as TEC pumps) can be used downhole to provide cooling for virtually any downhole tool. A TEC pump performs the same cooling function as a vapor compression refrigerator. They both move thermal energy from one region to another region, thereby reducing the temperature of the first region. The primary difference is that vapor compression-cycle devices have moving mechanical parts and require a working fluid, while TEC pumps are totally solid state.

Single stage TECs are typically capable of producing a temperature differential of approximately 70° C. (126° F.) under ideal conditions. Greater heat transfer rates are possible with multistaged or cascaded TEC arrangements in which the hot plate of one TEC stage transfers heat to the cold plate of another TEC stage. Thus, the terms "thermoelectric cooler" and "TEC" are used herein to include both a single stage thermoelectric cooler, as well as multistaged and cascaded arrangements of multiple thermoelectric cooler units or pumps.

Returning now to FIG. 4, an energy diverter 350 diverts excess or waste energy from the bus 363 to the bank of TECs via pathway 351. The TECs 372, 374, 376, 378 cause heat to flow from the respective components 342, 344, 346, 348 to the wall W of a drill collar housing the MWD tool string 380'. As the heat is transferred across the TECs, the temperature of their respective hot plates (see plate 576 of FIG. 5) is raised to levels that exceed the ambient temperature of the borehole mud, such that the heat transferred to the wellbore wall W is effectively dissipated in the borehole annulus by the flowing mud.

Figure 6:
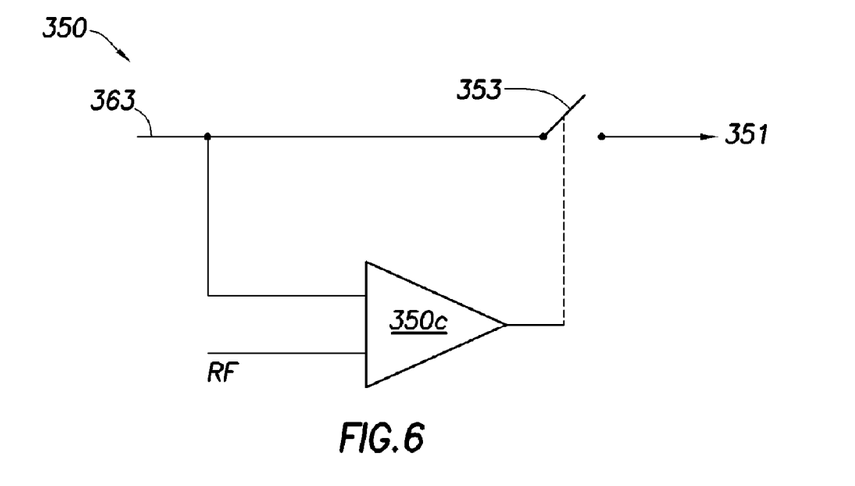
FIG. 6 is a more detailed schematic representation of the energy diverter of FIG. 4.

FIG. 6 shows the energy diverter 350 in greater detail. Thus, the energy diverter includes a voltage comparator 350c that compares the excess voltage supplied by bus 363 to a reference voltage RF. When the excess voltage exceeds the reference voltage, a switch 353 is closed to route the excess energy to pathway 351.

The present invention is therefore well adapted for diverting excess energy of available energy sources, which would otherwise be wasted by heat dissipation, and then applying the diverted excess energy to power TEC pumps. In drill-string conveyed embodiments according to the invention, the energy source may comprise: a turbine generator (see, e.g., assembly 38 of FIG. 2, and assembly 338 of FIG. 4) for converting the hydraulic energy of drilling fluid pumped through the drill string into electrical energy, and/or one or more batteries (see, e.g., power supply 337 of FIG. 4) conveyed with the tool string. In other wireline-conveyed embodiments of the inventive apparatus, the energy source may comprise a power supply (see equipment 84 of FIG. 1B) disposed at the surface and one or more electrical conductors running through the wireline (see wireline 83 of FIG. 1B) for conducting electricity between the power supply and the tool string.

Additionally, it will be appreciated that a tool string may be equipped in accordance with the present invention in several different ways. Thus, e.g., a tool string (whether conveyed by a drill string or a wireline) may comprise: one or more tools for sensing one or more survey parameters such as direction, inclination, and toolface; and/or one or more tools for sensing one or more parameters of a formation penetrated by the borehole, such as formation resistivity, natural radiation, density (gamma ray or neutron), and pore pressure. Examples of such tools are available from Schlumberger (among others), as described above. Each of these tools—as well as others (e.g., directional drilling devices)—may constitute active energy-consuming devices, in analogous fashion to the energy-consuming components of assembly 340' shown in FIG. 4. Moreover, each of these aforementioned downhole tools—as well as others—may constitute heat-generating devices with which TECs can then be selectively mounted to cool the critical components thereof that otherwise might not operate at elevated temperatures, or that might have their useful life significantly reduced by continued operation at elevated temperatures.

Figure 7:
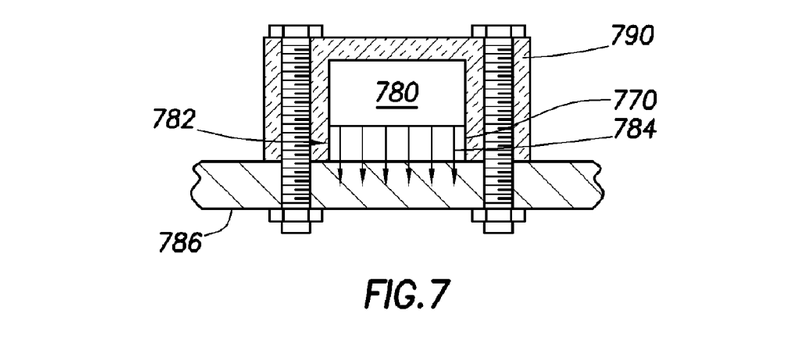
FIG. 7 shows a heat-generating component disposed in conductive engagement with a TEC in accordance with the present invention.

It will be appreciated that several TEC pumps may be used to selectively cool "hot spots" such as power devices and heat-sensitive components in a tool string. With reference now to FIG. 7, respective TECs 770 and heat-generating devices 780 would be encased in conductive engagement within an insulator 790 to induce heat flow 784 from the devices 780 to a heat sink 786 while preventing heating of nearby components. Where mechanical strength is required, the insulator could be made of a poor thermal conductor (but structurally strong material) like titanium. Control circuitry 782 will route waste energy to the TECs 770 as required and route excess waste energy to the energy sink 786 if necessary. System power could also be routed to the TEC pumps in the event the available energy source(s) are not generating sufficient energy to power the TECs.

It will be further appreciated that the present invention is not restricted to downhole applications. Indeed, virtually any application where excess energy is available can be adapted to apply such excess energy to power TECs for achieving component or system cooling. It will be understood from the foregoing description that various modifications and changes may be made in the preferred and alternative embodiments of the present invention without departing from its true spirit. This description is intended for purposed of illustration only and should not be construed in a limiting sense. The scope of this invention should be determined only by the language of the claims that follow. The term comprising within the claims is intended to mean including at least such that the recited listing of elements in a claim are an open set or group. Similarly, the terms containing, having and including are all intended to mean an open set or group of elements. A, an and other singular terms are intended to include the plural forms thereof unless specifically excluded.

What is claimed is:

1. An apparatus for cooling a tool string conveyed within a borehole, the tool string having one or more downhole devices that actively consume energy and a downhole energy-generating device, the apparatus comprising:
   one or more thermoelectric coolers carried by the tool string in conductive engagement with at least one of the devices that actively consumes energy; and
   an energy diverter carried by the tool string that diverts at least a portion of a waste energy from the downhole energy-generating device that is not consumed by the active energy-consuming devices to the thermoelectric coolers so as to provide cooling for the cooler-engaged energy-consuming device.

2. The apparatus of claim 1, wherein the tool string is part of a drill string conveyed within the borehole.

3. The apparatus of claim 1, wherein the tool string is conveyed within the borehole on a wireline.

4. The apparatus of claim 1, wherein the tool string comprises one or more tools that sense one or more survey parameters, including direction, inclination, toolface, and combinations thereof.

5. The apparatus of claim 1, wherein the tool string comprises one or more tools that sense one or more parameters of a formation penetrated by the borehole.

6. The apparatus of claim 2, wherein the tool string comprises one or more tools that enable and control the penetration of the drill string into the formation during conventional or directional drilling operations.

7. The apparatus of claim 2, wherein the downhole energy-generating device comprises a turbine generator for converting the hydraulic energy of drilling fluid pumped through the drill string into electrical energy.

8. The apparatus of claim 2, wherein the downhole energy-generating device comprises an alternator.

9. The apparatus of claim 1, wherein the active energy-consuming devices comprise one or more tools that sense one or more survey parameters, including direction, inclination, toolface, and combinations thereof.

10. The apparatus of claim 1, wherein the active energy-consuming devices comprise one or more tools that sense one or more parameters of a formation penetrated by the borehole.

11. The apparatus of claim 2, wherein the active energy-consuming devices comprise one or more tools that enable and control the penetration of the drill string into the formation during conventional or directional drilling operations.

12. The apparatus of claim 1, wherein the energy diverter comprises a voltage comparator.

13. An apparatus for cooling a system having one or more devices that actively consume energy and one or more devices that generate energy, the apparatus comprising:

one or more thermoelectric coolers disposed in conductive engagement with at least one of the devices that actively consume energy; and an energy diverter disposed so as to divert at least a portion of a waste energy from the one or more devices that generate energy that is not consumed by the active energy-consuming devices to the thermoelectric coolers so as to provide cooling for the cooler-engaged devices that actively consume energy.

14. The apparatus of claim 13, wherein the system comprises a tool swing conveyed within a borehole.

15. The apparatus of claim 14, wherein the tool string is conveyed within the borehole by a drill string or a wireline.

16. The apparatus of claim 13, wherein the energy diverter comprises a voltage comparator.

17. A method for cooling a downhole system, the method comprising the steps of:

generating energy in the downhole system;

diverting at least a portion of a waste energy to a thermoelectric cooler disposed within the downhole system.

18. A downhole tool string, comprising:

one or more devices that actively consume energy;

an energy-generating device;

one or more thermoelectric coolers in conductive engagement with at least one of the devices that actively consume energy; and an energy diverter configured to divert at least a portion of a waste energy from the energy-generating device to the thermoelectric coolers.

\* \* \* \* \*